(12) United States Patent
Murphy et al.

(10) Patent No.: US 9,183,908 B2
(45) Date of Patent: Nov. 10, 2015

(54) METHOD AND APPARATUS FOR MEMORY ACCESS

(75) Inventors: Andrew Murphy, London (GB); Oliver Paul Haffenden, Tooting (GB)

(73) Assignee: British Broadcasting Corporation, London (GB)

( * ) Notice: Subject to any disclaimer, the term of this patent is extended or adjusted under 35 U.S.C. 154(b) by 463 days.

(21) Appl. No.: 13/483,795

(22) Filed: May 30, 2012

(65) Prior Publication Data

US 2013/0064022 A1 Mar. 14, 2013

(30) Foreign Application Priority Data

May 31, 2011 (GB) .................................. 1109177.4

(51) Int. Cl.
    *G11C 8/00* (2006.01)
    *G11C 8/18* (2006.01)
    *G11C 8/12* (2006.01)
    *H03M 13/27* (2006.01)
    *H03M 13/00* (2006.01)

(52) U.S. Cl.
    CPC .. *G11C 8/18* (2013.01); *G11C 8/12* (2013.01); *H03M 13/275* (2013.01); *H03M 13/276* (2013.01); *H03M 13/2789* (2013.01); *H03M 13/6552* (2013.01)

(58) Field of Classification Search
    CPC .......... G11C 8/10; G11C 8/12; G11C 11/412; G11C 7/22
    USPC ........... 365/233.13, 233.18, 189.011, 189.04, 365/230.01, 230.02, 230.03, 230.04, 230.08
    See application file for complete search history.

(56) References Cited

U.S. PATENT DOCUMENTS

| | | | |
|---|---|---|---|
| 2009/0125780 A1* | 5/2009 | Taylor et al. ................... | 714/752 |
| 2009/0296840 A1* | 12/2009 | Atungsiri et al. ............. | 375/260 |
| 2010/0174883 A1 | 7/2010 | Lerner et al. | |
| 2011/0167228 A1* | 7/2011 | Yamada et al. ............... | 711/154 |

FOREIGN PATENT DOCUMENTS

| | | | |
|---|---|---|---|
| GB | 2465611 A | | 11/2008 |
| GB | 2465611 | | 5/2010 |
| GB | 2465611 A | * | 5/2010 |

(Continued)

OTHER PUBLICATIONS

"Digital Video Broadcasting (DVB); Frame structure channel coding and modulation for a second generation digital terrestrial television broadcasting system (DVB-T2);" European Standard (Telecommunications series); Final Draft ETSI EN 201 755 v1.2.1; Oct. 2010.
Search Report from GB Patent Office dated Sep. 28, 2011.
http://en.wikipedia.org/wiki/Interleaved_memory.
http://www.amazon.co.uk/Humax-HD-FOX-T2-Freeview-Set/dp/tech-data/B0036TGN8K.

(Continued)

*Primary Examiner* — Son Dinh
*Assistant Examiner* — Uyen B Tran
(74) *Attorney, Agent, or Firm* — Daly, Crowley, Mofford & Durkee, LLP

(57) ABSTRACT

An interleaver or deinterleaver comprises a memory having M logical memory units arranged in groups of N memory units such that accesses to memory units within a group are faster after a first access to a memory in that group using first access. An address generator is arranged to write consecutive data items a number of memory units apart that is less than the size of groups N of memory units so that two or more data items are written within groups. The arrangement provides fast interleaving without increasing memory size.

27 Claims, 10 Drawing Sheets

(56) References Cited

FOREIGN PATENT DOCUMENTS

| WO | WO 96/37050 | | 4/1996 |
|---|---|---|---|
| WO | WO 2005/091509 | A1 | 3/2005 |
| WO | WO 2005/091509 | A1 | 9/2005 |
| WO | WO 2009/060185 | A2 | 11/2008 |
| WO | WO 2009/060185 | A3 | 11/2008 |
| WO | WO 2009/060185 | A2 | 5/2009 |
| WO | WO 2009/060185 | A3 | 5/2009 |

OTHER PUBLICATIONS

"Digital Video Broadcasting (DVB): Frame structure channel coding and modulation for a second generation digital terrestrial television broadcasting system (CVB-T2);" Final Draft ETSI EN 302 755 V1.2.1; Oct. 2010; 177 pages.

European Search Report; dated Nov. 5, 2012; for EP Pat. App. No. 12250106.7-1229; 7 sheets.

Great Britain Search Report; dated Sep. 27, 2011; for GB Pat. App. No. 1109177.4; 1 sheet.

* cited by examiner

METHOD AND APPARATUS FOR MEMORY ACCESS

BACKGROUND OF THE INVENTION

The present invention relates to methods and apparatus for memory access, in particular to memory access in which data is written to and read from memory using a known address incrementing scheme having address jumps.

Random access memory (RAM) may be used in various systems for rearranging data. An interleaver, for example uses a block of memory to write data in one order and then read that data in a different, interleaved, order. An example of such an interleaver is one in which data is written in columns and read in rows, thus rearranging the data in an interleaved fashion. Other examples of such memory arrangements include systems for filtering data or rotating image data. More generally, such systems have an address incrementing scheme in which the read and/or write addressing jumps through data with a defined jump length.

There are two principal types of RAM: Static RAM and Dynamic RAM

In a static RAM, the access time associated with each location is constant and commonly-available parts (such as the 72 Mbit module on the HAPS-51 board) are more than fast enough to operate at the DVB-T2 cell rate (9.14 Mcell/s for 8 MHz system bandwidth). Static RAMs use flip-flops to hold the state of each bit and will maintain their contents as long as they are powered.

Dynamic RAM is based on a different structure. The memory cells are based on capacitive elements that are laid out in a grid of rows and columns and use fewer transistors. In terms of timing, accessing rows is expensive. However once a row is 'open' (activated), access to subsequent columns on the same row is considerably faster. Furthermore, Synchronous Dynamic RAMs operate in bursts so that for each requested access to a given column, one or more subsequent columns are also accessed on subsequent clock cycles. Once a row is finished with it must be closed (pre-charged) which acts to re-charge the capacitive cells. There is a maximum time that any given row can be open, i.e. between an activate and a pre-charge, after which too much charge will have leaked from the capacitive cells and the data corrupted. Since the memory cells are based on capacitors, over time the charge in each one leaks away and so the entire chip much be periodically refreshed. This further reduces the effective throughput.

Dual Data Rate (DDR) SDRAM transfers data on both the rising and falling edge of the clock. Thus the maximum transfer rate is twice that of the I/O bus clock speed. DDR2 is a later enhancement that clocks the memory at half the I/O bus clock speed and increases the amount of data that is pre-fetched (locally cached) before it is required on the data bus. As a result, the I/O clock speed of DDR2 can be doubled compared with DDR resulting in transfers at twice the bandwidth.

As previously described, RAM is used in various systems in which there is a need to 'Jump' through data. A particular example of use of a memory as described above is in a time interleaver for DVB-T2 TI blocks. The DVB-T2 standards are known to the skilled person, for example in "Digital Video Broadcasting (DVB); Frame structure channel coding and modulation for a second generation digital terrestrial television broadcasting system (DVB-T2) ETSI 302755."

The DVB-T2 standard supports service-specific robustness through the use of Multiple Physical Layer Pipes (PLPs). Different services carried on different PLPs can be configured with a different code rate and constellation. Furthermore, each PLP can have different time interleaver parameters. Whilst a receiver is only required to be able to receive two PLPs simultaneously, a modulator is required to transmit every PLP and therefore requires a separate time interleaver memory for each PLP.

For Multiple PLP operation, the allocation and scheduling is carried out in a T2-Gateway and carried over the DVB-T2 Modulator Interface (T2-MI) to the modulator for subsequent coding and transmission.

Further storage may also be required in the modulator when In Band Signalling and/or L1-repetition are used. If the T2-Gateway processes incoming TS packets and generates the BB-frames immediately, then the modulator is required to have a further Interleaving Frame's worth of storage per PLP since the In-Band Signalling information for the current Interleaving Frame will only be available at the end of the next Interleaving Frame.

Most modulator implementations are based on Field Programmable Gate Arrays (FPGAs) such as those made by Xilinx and Altera. Whilst these have a reasonable amount of on-board block memory, even a single time interleaver typically requires the use of external RAM. Normally this would be static (SRAM) since it is easy to drive and the time taken to access each location is constant; provided a part of appropriate speed is chosen, the DVB-T2 time interleaver can be mapped directly onto it.

The problem with using an SRAM is that it is very expensive when compared to the large, low cost, Synchronous Dynamic RAM (SDRAM) modules that are prevalent in modern Personal Computers. The downside of SDRAM is the more complicated timing requirements; the time taken to access a given memory location varies enormously and depends on the locations of previous reads and writes.

SUMMARY OF THE INVENTION

We have appreciated the need to provide an arrangement in which memory such as dynamic RAM may be used in systems of the type in which data is written and/or read according to an address jumping scheme. In particular, we have appreciated the need to allow dynamic RAM to be implemented within an interleaver, such as for DVB-T2 in a manner that is sufficiently fast for the required data rates.

The invention is defined in the claims to which reference is now directed.

An embodiment of the invention provides apparatus for storing and retrieving a stream of data received in successive blocks having an input for receiving an input data stream of input data items arranged as blocks. A memory is coupled to the input, the memory having M logical memory units arranged in groups of N memory units such that accesses to memory units in a group are faster after a first access to a memory unit in that group. An example difference in speed is where a memory has faster read/write access for sequential memory locations than for non-sequential locations, such as dynamic RAM, in particular SDRAM. Each group of memory units may be a row of memory for which opening the row to access one memory unit allows faster subsequent access to other memory units in the row. Each group of memory units may be a burst length of memory units that may be accessed in a single burst.

An address generator is coupled to the memory to address the memory units of the memory to write data input items received in the data stream at the input to memory units in the memory and to read data items from the memory units in the memory and an output is coupled to the memory to receive and output the data items from memory units read from the memory to form an output data stream. The address generator generates the addresses of memory units by dividing each block into strips having a strip length n, writing consecutive data items such that they are n memory units apart and reading consecutive memory units, wherein n<N such that two or more data items may be written within groups of N memory units and two or more data items may be read from groups of N memory units. Various values of the strip length n and group N are possible such that two or more data items are written for some or all groups. Depending upon the choice of these values, two or more data items will be written to some of the groups, but only one data item will be written to other groups. On average, though, more than one data item will be written to each group.

Where the memory is arranged as rows and columns, and the group comprises a row, this arrangement ensures that the advantage of speed of opening each row is balanced between read and write access, thereby optimising the speed of writing and reading a whole block.

The input data stream may be such that consecutive data items are received in consecutive order and the address generator generates the addresses such that consecutively received data items are written n memory locations apart. Alternatively, the data items may be received partially or wholly in the order to be written, in which case the address generator may accommodate this to give the end result that consecutive data items are written n memory units apart. An embodiment of the invention provides for re-structuring the DVB-T2 Time Interleaver in a way that can be implemented successfully in a SDRAM. This serves to reduce the cost of a Multiple PLP modulator and, in turn, addresses concerns about the memory requirements of Multiple PLPs and the practicality of fully implementing support of the T2-Modulator Interface protocol (ETSI TS 102773).

BRIEF DESCRIPTION OF THE DRAWINGS

The invention will now be described in more detail by way of example with reference to the drawings, in which.

DETAILED DESCRIPTION OF THE PREFERRED EMBODIMENTS

The embodiment of the invention described is a time interleaver for cells of data arranged as DVB-T2 blocks. A cell in this context is the smallest unit or item of data to be interleaved with other such cells. A block is the amount of data within which interleaving is to be performed. The DVB-T2 standard is known to the skilled person, but for ease of reference the interleaving arrangement in DVB-T2 will first be described with reference to FIG. 2.

Figure 2:
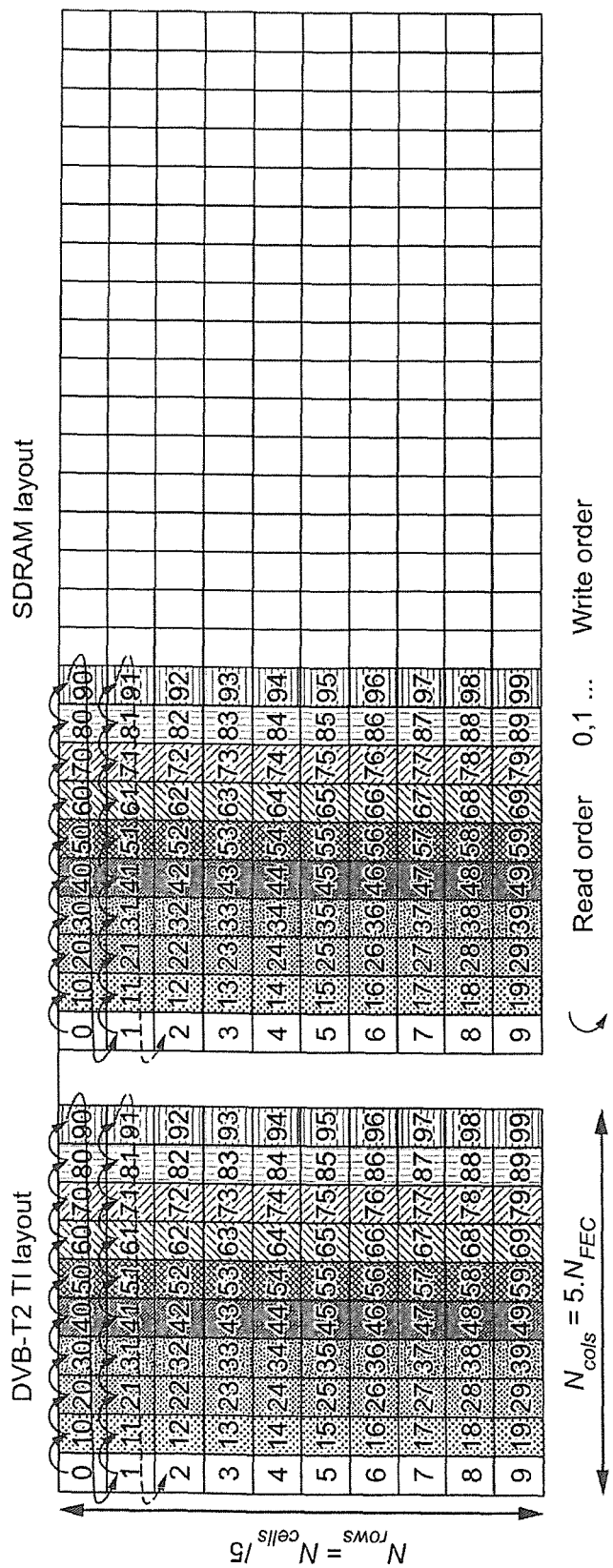
FIG. 2: is a schematic diagram DVB-T2 time interleaver data mapped directly into SDRAM rows and columns.

The unit of time interleaving in DVB-T2 is the TI block. The physical time interleaver memory is defined as a TI block with a maximum size of $2^{15}+2^{19}$ cells. FIG. 2 shows a block of data comprising $N_{rows}=N_{cells}/5$. The number of columns $N_{cols}=5 \cdot N_{FEC}$ where $N_{FEC}$ is the number of FEC blocks. A FEC block contains a fixed number of cells, and a TI block contains a whole number of FEC blocks. The number of FEC blocks in a TI-block can vary from TI-block to TI-block.

DVB-T2 also has the concept of a so-called Interleaving Frame (IL Frame). There are two types of mapping between the TI blocks and IL Frames; either IL Frames are:

mapped to one T2-frame and made up of one or more TI blocks ($P_I=1$, $N_{TI}>=1$), or mapped to multiple T2-frames and made up of a single TI block ($P_I>1$, $N_{TI}=1$).

When designing a modulator, the key issue is the maximum memory requirement for the interleaving frame for each PLP. In the first instance, where more than one TI block may be used, the limiting factor is the maximum capacity of a T2 frame. This is 1858500 cells and is shared across all PLPs (since the PLPs cannot use more capacity than that available in the T2 physical frame). In the second case, the interleaving frame is confined to the maximum size of a single TI block, i.e. the $2^{15}+2^{19}$ cells.

Therefore, the total required to store a single Interleaving Frame across all 255 PLPs is: $1858500+(2^{15}+2^{19})\times 255=143907880$ cells The DVB-T2 maximum constellation size is 256-QAM, although this can be rotated and the axes separated with a cyclic Q-delay to effectively give $256^2=65536$ points. This therefore requires a minimum 16 bits to store each constellation point if the mapping to complex values is carried out after the time interleaver.

Therefore at 16 bits per cell, the total storage is: 287 Mbytes per Interleaving Frame. To reduce the complexity of the implementation, it is easier to statically allocate parts of the RAM to individual PLPs and the larger figure of 1858500 cells is relevant per PLP. Therefore a maximum of 3.7 MB is required to store each Interleaving Frame per PLP (at 16 bits per TI cell).

The additional Interleaving Frames' worth of delay that may be required if In-Band Signalling or L1-repetition are used could be stored as incoming bytes, however, given the large amount of RAM available in a 1 GB SDRAM, it may as well be stored as cells.

In the embodying modulator hardware, the time interleaver may also be used as a FIFO and more than one Interleaving Frame's worth of storage is also therefore required. Slight additional storage may also be required to account for variations in network delay. Allowing a generous four Interleaving Frames' worth of storage gives a maximum memory requirement of 14.868 MB at 16 bits per cell. This means that around 66 PLPs could be handled in a low-cost 1 GB SDRAM, a number which is likely to handle most practical applications for DVB-T2. Using a more flexible approach to allocation of the time interleaving memory would allow the maximum number of 255 PLPs to be handled, although no current applications would require so many PLPs.

A possible approach to writing data to an SDRAM interleaver would be to directly map the rows and columns of the Time Interleaver onto SDRAM rows and columns. This approach is illustrated in FIG. 2 where writes are in number order and the read order follows the blue arrows. As can be seen, data is selected from the TI block and written in sequential order down columns of the SDRAM. Data is then read from the SRAM along rows, thereby interleaving the data with an effective jump length equal to the number of rows (here 10). The downside of this approach is that it is somewhat wasteful of memory due to the presence of unused words in each SDRAM row.

Since SDRAM words are typically longer than TI cells, each SDRAM word (typically 64 bits) can hold multiple TI cells (chosen to be 32 bits). In the following example, the TI cell is chosen to be 32 bits, but equally could be 16 bits as previously described. When writing an SDRAM word, mask bits allow the user to only update certain bytes of the SDRAM word. For an SDRAM word length of 64 bits (W=64) and a TI cell size of 32 bits (C=32), each SDRAM word can hold 2 TI cells. For the DDR2 example, this means that each SDRAM row can hold a maximum of 2048 TI cells. The maximum TI width is 1375 columns (in the case of FEC blocks of 16200 bits and the maximum allowed 275 FEC blocks).

In this example, the time taken for alternating reads and writes to random locations is greater than the T2 cell period, namely the elementary time period for the bandwidth used, for example 109 ns. The key, therefore to making a scheme that works is to take advantage of the fact that on each access a burst of SDRAM words is read or written and to perform multiple reads and writes for each row/column access, thereby sharing the overhead for opening and closing a row across multiple cells.

In this example, since reads happen sequentially along rows, each burst read of length BL=4 gives the data for 8 TI cells (because each SDRAM word holds 2 TI cells). However, since the minimum sub-slice length is 5, the worst case is that a single burst read will only yield 5 cells that are useful because the next cell required may be from a different PLP within a different part of physical memory. This therefore reduces the read time for each cell by approximately a factor of 5 (rather than a factor of 8) such that, $T_{cell\_read}$=16.4 ns. The time for a cell write, $T_{cell\_write}$ remains at 109.4 ns since only one write can be performed per SDRAM row access. Unfortunately this is not fast enough to meet the minimum cell period of 109 ns at the chosen bandwidth of 8 MHz, even without allowing for refreshes.

The sub-slice mentioned above is a feature of the DVB TI arrangement. In order to allow maximum flexibility to select time interleaver characteristics, DVB-T2 allows the output of the time interleaver to be split into multiple sub-slices whereby groups of cells of different PLPs are mapped to different parts of the DVB-T2 frame.

The direct mapping of the TI rows and columns into the DDR2 in the above example exposes the large discrepancy between the time taken to read versus the time taken to write a given cell. Reads are so efficient because the overhead of opening the row and column is spread across several cells read in a single burst. In contrast, writes are inefficient since, each burst write to the SDRAM only writes one TI cell.

With the above background, the mapping scheme embodying the invention will now be described with reference to FIGS. 3, 4 and 5.

Figure 3:
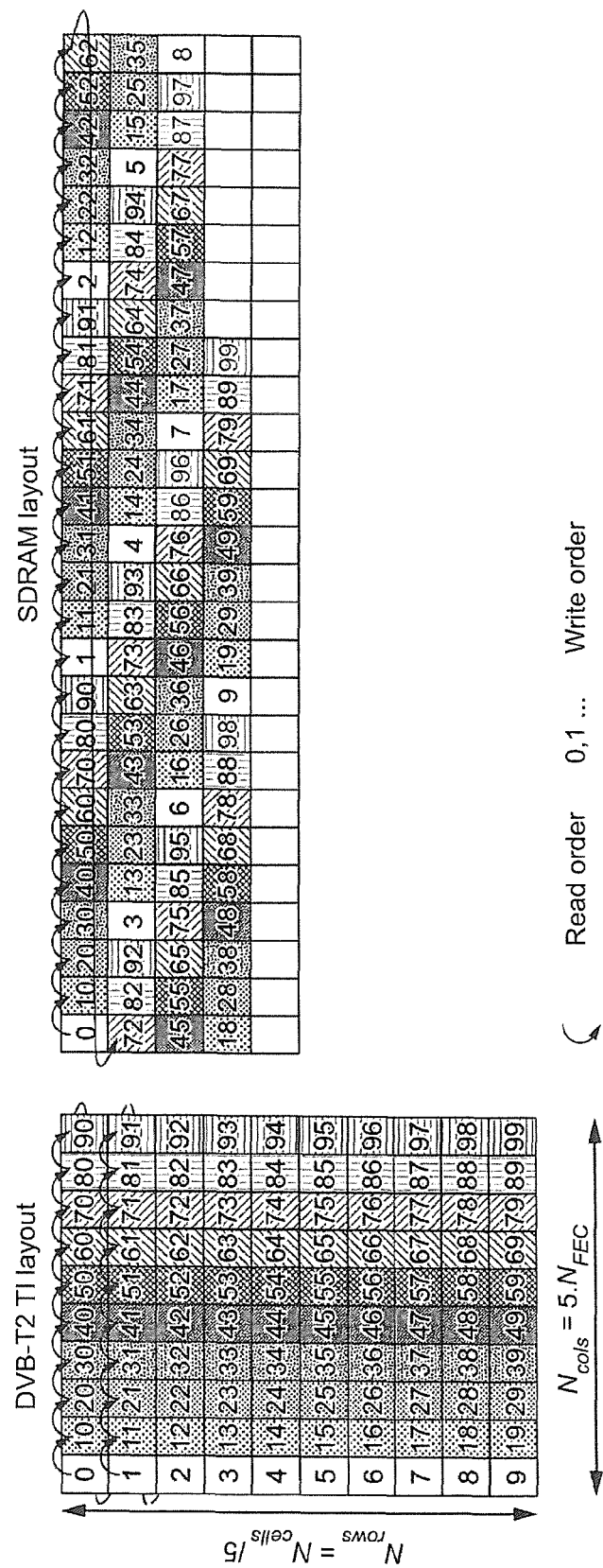
FIG. 3: shows an SDRAM layout in which DVB-T2 data has been concatenated along SDRAM rows.

A more memory-efficient implementation is illustrated in FIG. 3 whereby TI rows have been concatenated along SDRAM rows. However, if reads and writes are alternated, this suffers from the same problem as above, in that each burst write requires the row to be opened and closed. Reading is slightly worse since some groups of five cells are spread across multiple SDRAM rows, requiring two or more row open and close operations.

Figure 4:
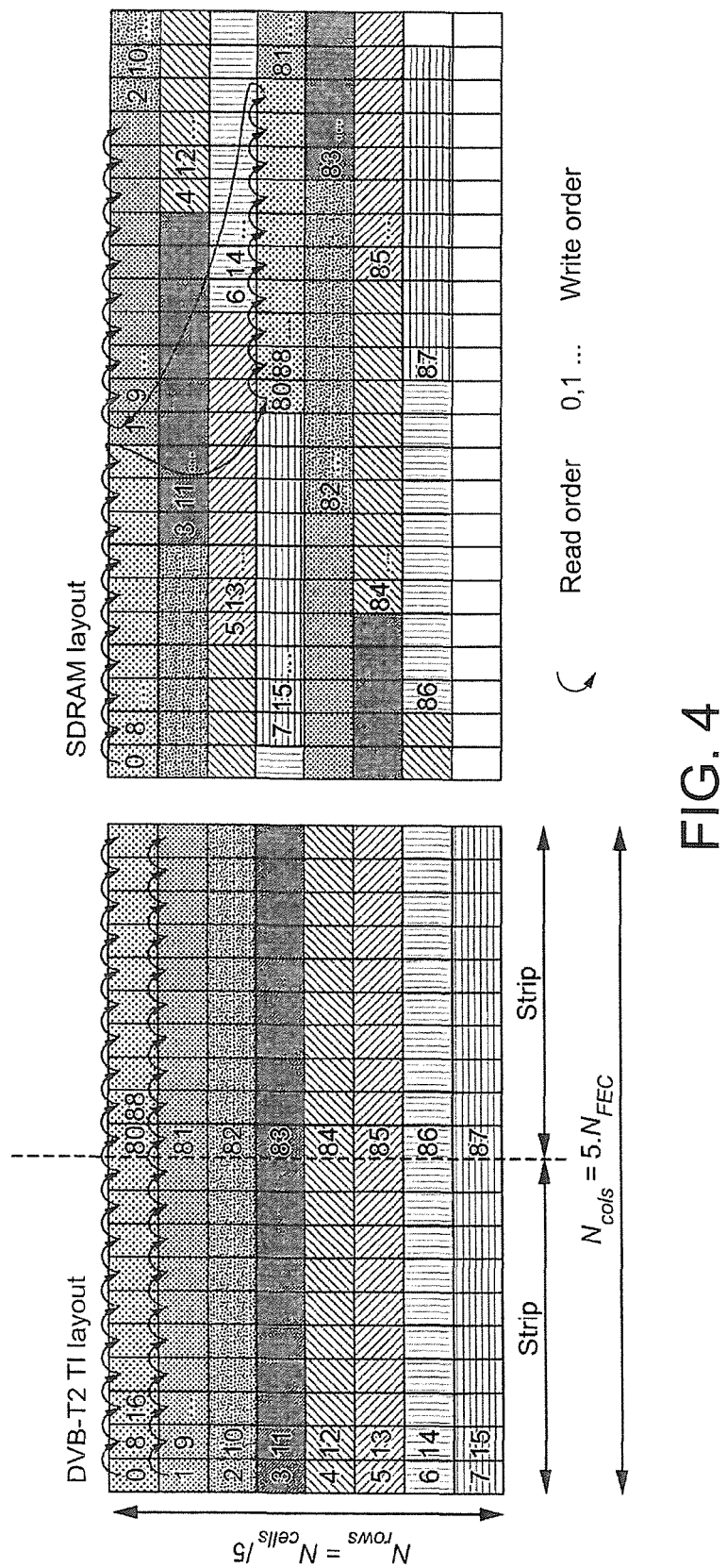
FIG. 4: shows an SD-RAM arrangement embodying the invention in which DVB-T2 block rows are split into strips.
Figure 5A:
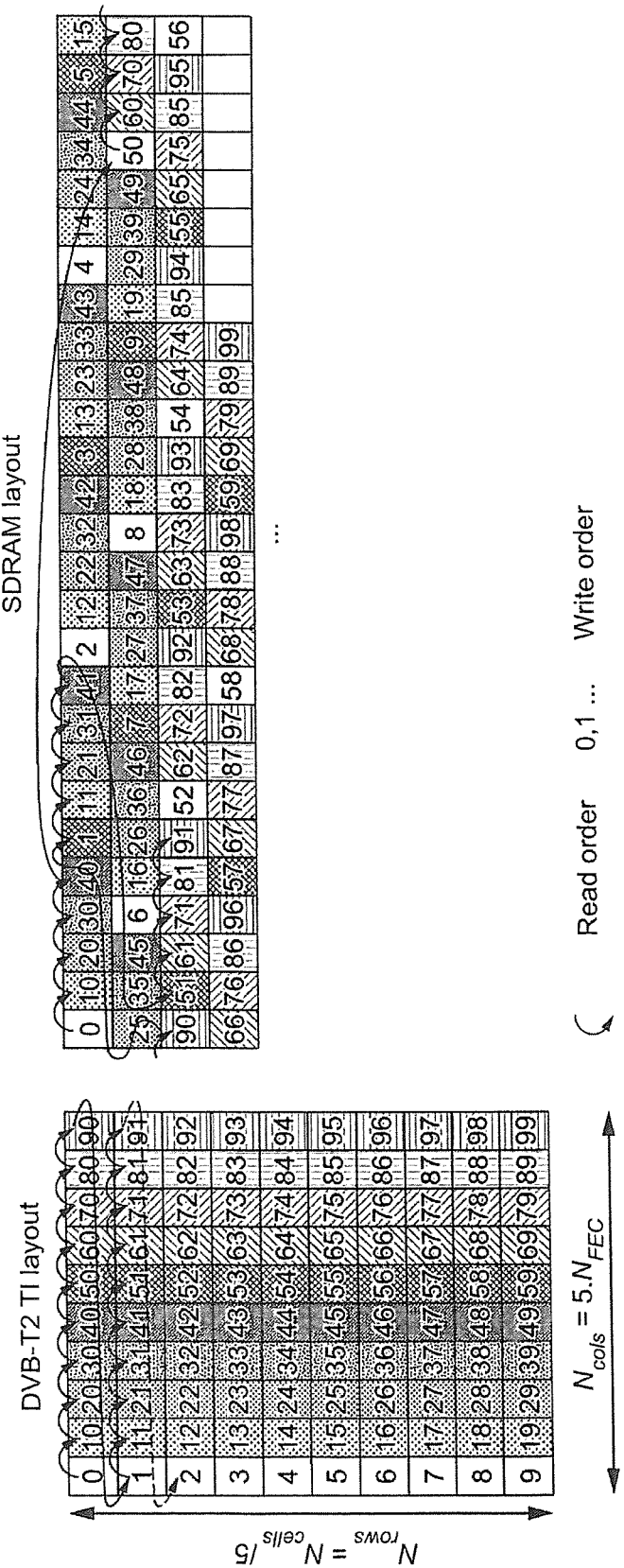
FIG. 5A: shows a preferred embodiment in which DVB-T2 data is split into strips of five cells for loading into SD-RAM.
Figure 5B:
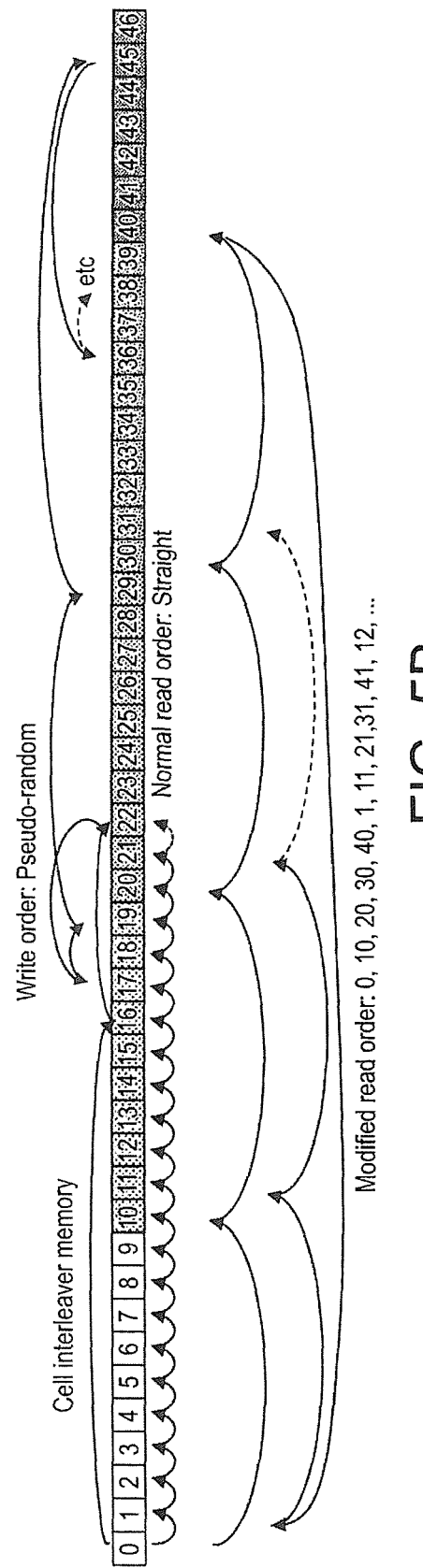
FIG. 5B: shows an alternative arrangement of FIG. 5A.
Figure 5B:
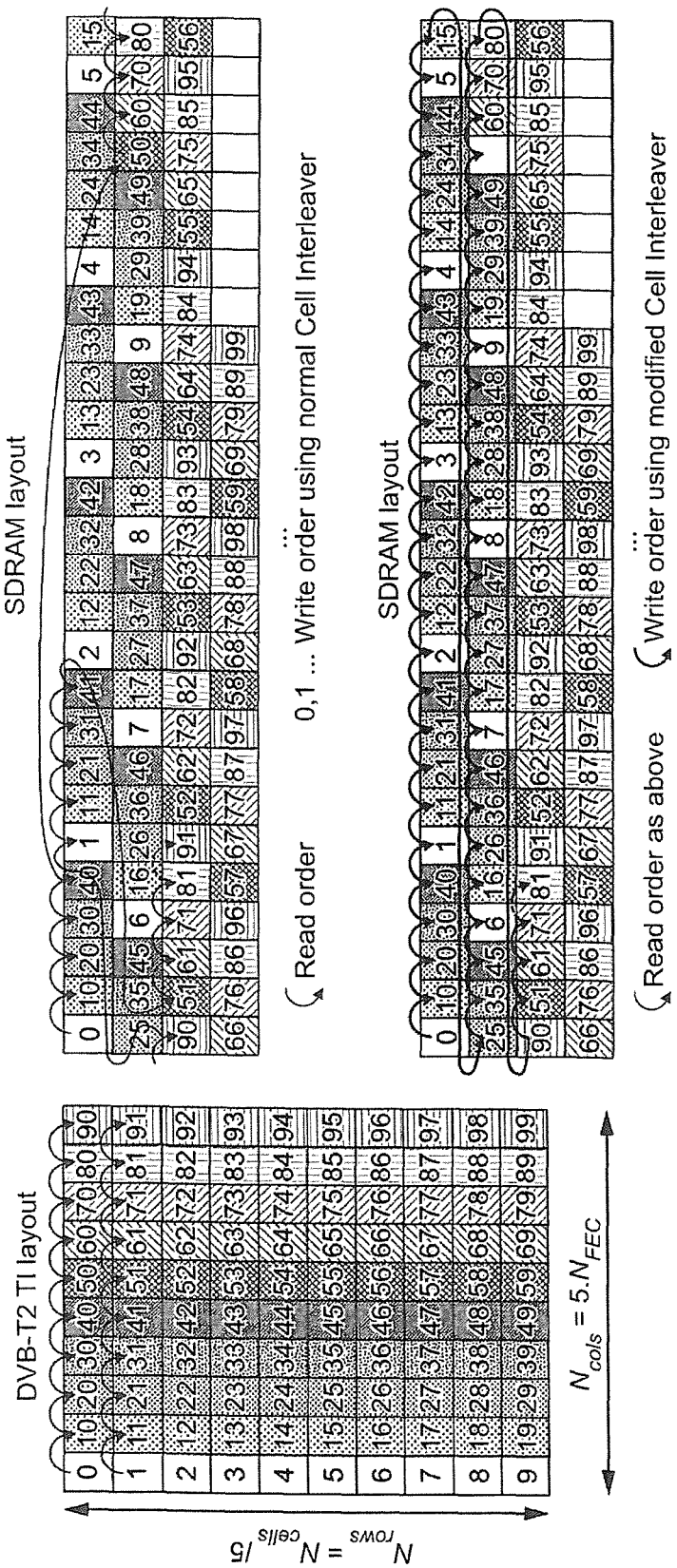

An arrangement embodying the invention is shown in FIG. 4. By splitting each TI row into multiple strips and re-arranging them in the DDR2, as illustrated in FIG. 4, it is possible to ensure that more than one consecutive write access will always occur along each DDR2 row, thereby spreading the row access overhead across more cells. To take advantage of this, either multiple banks could be used for reading and writing (keeping one bank and hence row open for the subsequent writes) or reads/writes could be cached and performed in twos or more.

The operation of the arrangement of FIG. 4 is as follows. A block of DVB data as shown on the left of FIG. 4 is notionally split into strips. Each strip comprises data items or cells that will be written into sequential locations in the interleaver memory. Cells are taken in turn as shown by the numbering sequence 0, 1, 2, 3, . . . $N_{cells}$ and written to the memory. In contrast to prior arrangements, however, the cells are not written such that they are written down columns (an address increment for each successive write that is equal to the length of a row). Instead, cells are written with an address increment equal to the strip length. As can be seen the result is that the address sequence for the values 0, 1, 2, 3 is addresses 0, 10, 20, 30, namely an address increment equal to the strip length of 10.

The speed advantage of this addressing scheme can now be seen. On writing, when a given row is opened, typically 2 cells are written (for example values 0 and 1 in one row opening, values 3 and 4 in another row opening). There is therefore a significant saving when writing, rather than opening a new row for each write. In fact, as shown, greater than 2 cells will be written on some rows (here values 0, 1, 2 are written on the first row). When reading, bursts of 4 memory locations (8 cells) can be read for each access and so there is little impact on the reading speed.

For DVB-T2, the problem with always splitting into two strips (or some other multiple) is that the time taken by reads and writes will vary depending on the Number of FEC blocks in a TI-block which varies dynamically. Also, from an implementation viewpoint, the number of columns in the TI is not always a multiple of 2 and so calculation of the split point is more involved. Rather than splitting the TI rows into a fixed number of strips (of varying width), a more sensible approach is to keep the length of the strip constant but have a varying number of strips per TI row.

The question then arises as to what the length of a strip should be. A strip length of five is a sensible choice for two reasons. Firstly the TI rows are always a multiple of five cells long since, $N_{cols}$=5·$N_{fec}$. Secondly, as examined above, the minimum number of cells in a sub-slice to be read from the TI will also be five. There is therefore no advantage in having more cells accessible in a single burst.

The number five has the big advantage that, on writing, a single SDRAM burst access can write two TI cells of data which dramatically reduces the overhead of opening and closing the row. The approach is illustrated in FIG. 5. Note how the cells for a single FEC block are stored in a contiguous block of memory in the SDRAM, albeit out of order. This approach guarantees that, on reading a minimum of five cells will be read consecutively. As before, if reads and writes are not alternated but rather only occur when data for a burst is required, these can be read in a single burst access which is highly efficient.

On writing, every fifth location on an SDRAM row is written to (5 being the strip length). For a burst length of 4, this typically means 2 writes per burst for 32 bit cells and 64 bit memory locations. This is because a burst length of 4 memory locations comprises 8 TI cells and so 2 cells that are 5 memory locations apart can typically be written in a single burst. The embodiment thus provides two advantages: typically many cells of data can be written for each row opening, and also two cells of data can typically be written in a single burst.

Figure 6:
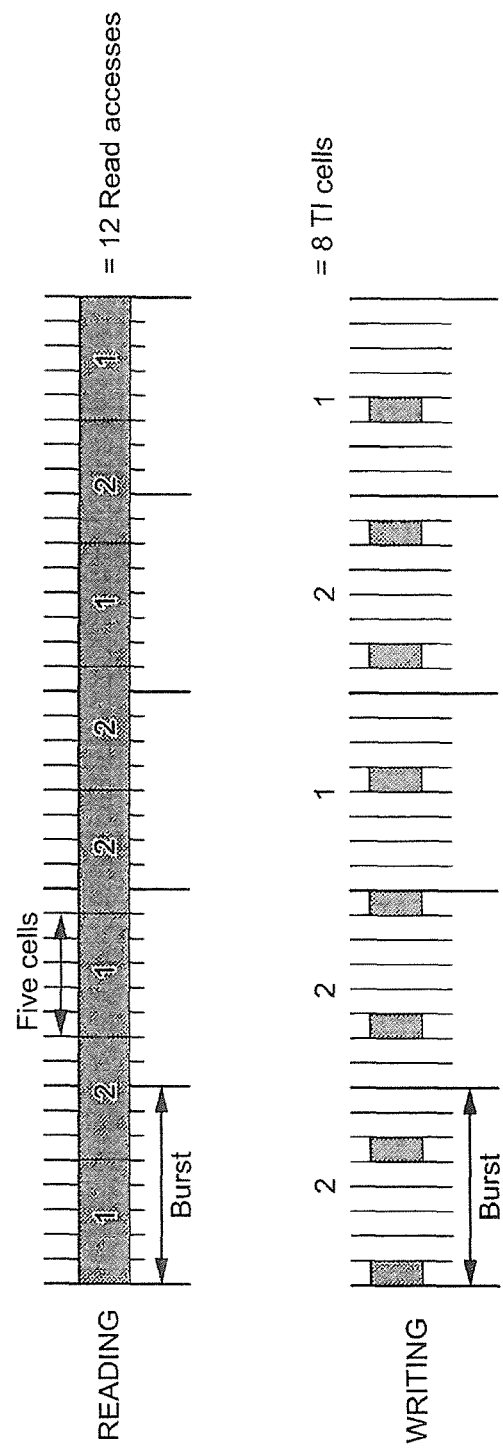
FIG. 6: is a diagram showing read and write burst access demonstrating the timing advantage of an embodiment of the invention.

An analysis of the time saving given will now be presented with reference to FIG. 6. With the large (e.g. 1 GB) RAM split into different areas for the Time Interleaver for each PLP, it is possible to calculate the worst-case access times in the proposed new TI structure. For reading, where the maximum amount of sub-slicing is used, the worst case is the reading of five TI cells from a previously un-opened row. On occasions, the run of five cells will span more than one burst on a single row. Furthermore, some runs of five will wrap across two rows.

In the following section, the worst case is assumed, i.e. that each and every burst access requires a row to be opened and subsequently closed. By analysing the timings in terms of burst accesses, runs that wrap across rows will also be taken into account since there are always whole numbers of complete bursts in a SDRAM row.

Eight runs of 5 cells are spread over five bursts. However, since some runs span multiple bursts, they will require multiple row accesses. FIG. 6 shows the number of row accesses for each set of five cells over the course of 40 cells, after which the pattern repeats.

This gives a total of 12 reads required for 8 bursts. This pattern also continues over the end of SDRAM rows until the whole pattern repeats after 2048×5=10240 cells. Therefore, the time taken to read a single cell is, on average:

$$T_{read\_cell} = \frac{12}{40}(T_{read})$$

Where $T_{read\_cell}$ is the average time to read each cell (24.6 ns in the example considered) and $T_{read}$ is the time taken to read a burst from a previously unopened row.

A similar analysis can be carried out for writing, as shown in the bottom half of FIG. 6. Again, the pattern repeats over 5 bursts. This time, 5 burst writes can yield 8 cell writes. Assuming that writes are only carried out when the data for a complete burst is available, the average time taken to write one cell is given as:

$$T_{write\_cell} = 5/8(T_{write})$$

$$T_{write\_cell} = \frac{5}{8}(T_{write})$$

Where $T_{write\_cell}$ is the average time to write each cell (68.4 ns in the example considered).

This gives a total read/write time per cell of 93 ns, which allowing for refreshes is 95.5 ns. This is well below the required 109 ns period and does not require multiple bank handling by the SDRAM controller.

An example hardware implementation of the Time Interleaver comprises a HAPS-51 development board using a Xilinx 5 and a DDR-667 part KVR667D2U5/1G. The DDR2 controller uses FIFOs for commands and data. Since the RAM can easily cope with the minimum T2 cell period, these FIFOs are generally almost empty so the delay through them will be small. Therefore only a very small additional FIFO is required on the output, to account for the delay between row activation and the data coming out to allow data to be available 'immediately' as required by the particular implementation of the frame builder block that follows.

It has already been noted that in the new TI structure, cells from a single FEC block are stored in a contiguous block. Since the Cell Interleaver block immediately precedes the Time Interleaver, it is possible to read out the cells of the cell interleaver in the order required by the new TI structure and write them directly in straight order into the DDR2 memory. This affords a significant time saving as writing of the cells can now be done in bursts making writing as efficient as reading. In this case, $T_{write\_cell}$ will approach the low value of $T_{read\_cell}$.

Inspection of the DVB-T2 specification (EN 302 755) will confirm that the Cell Interleaver is defined in such a way that it can be implemented by writing to a memory in a permuted order (the qth input cell is written to address $L_r(q)$ where $L_r(q)$ is the permutation function) and read in straight order (the qth output cell is read from address q). This is illustrated by the "write order" and "normal read order" sequences in FIG. 5B.

In the modified Cell Interleaver scheme, the Cell Interleaver memory would still be written to in the same order, but the cells would be read in the order in which they will be stored in the Time Interleaver memory, shown as "modified read order" in the figure. The qth output cell would therefore be read from the following address in the Cell Interleaver memory:

$$N_{rows}(q \bmod 5) + \lfloor q/N_{rows} \rfloor$$

The cells are then written into the SDRAM of the Time Interleaver in straight order, as shown by the red arrows in the figure.

Note that the Cell Interleaver itself is much smaller than the Time Interleaver and can therefore be implemented using static RAM, so there is no problem with reading from the Cell Interleaver memory in a different order.

Figure 1:
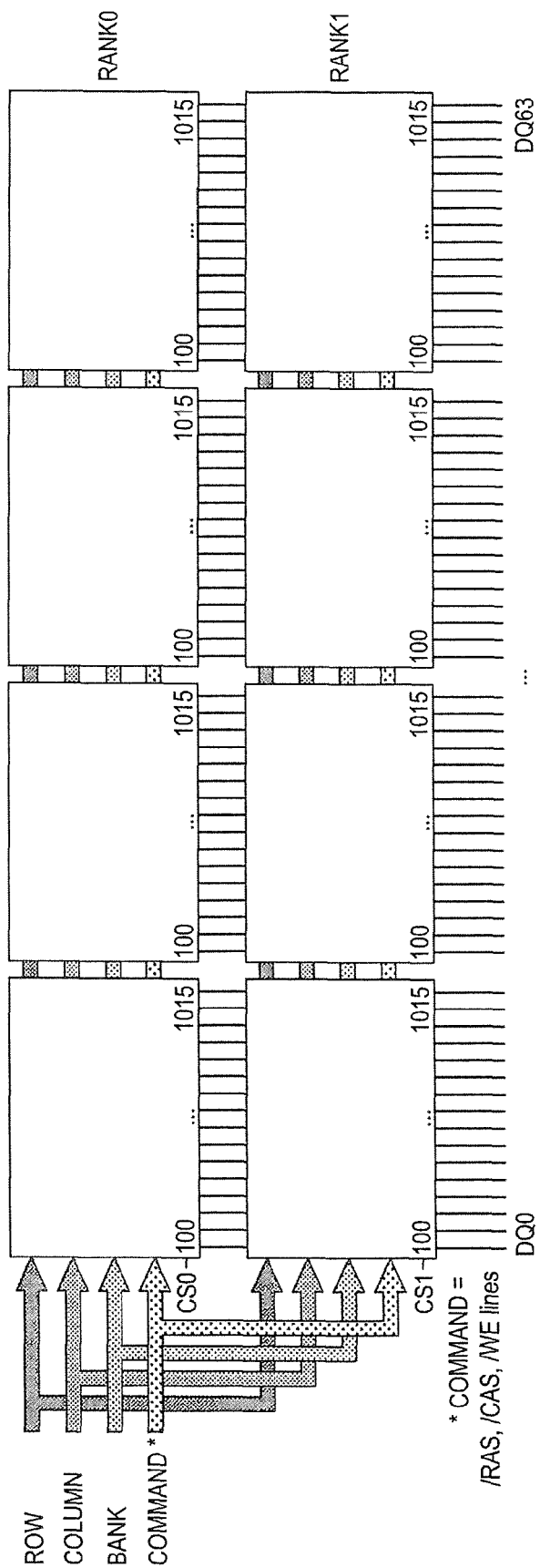
FIG. 1: is a schematic diagram of typical RAM modules as may be used in DVB-T2.

A specific hardware implementation and the time efficiencies gained will now be described in greater detail for completeness. An example DDR2 RAM module is shown in FIG. 1.

DDR2 RAM modules are made up of individual DDR2 chips in particular arrangements. There are a number of possibilities but the module used on the HAPS-51 uses a layout illustrated in FIG. 1.

Each physical side of the module PCB carries four DDR2 chips (in a "rank") which are 16 bits wide. These are placed in parallel to give 64 bit data words. The particular rank to be accessed is activated using chip select lines from the controller. In this instance, the chips belonging to different ranks are on different sides of the module PCB.

The interface to each individual chip is made up of a command (such as open, read, write, etc.) and an address. This address is, in turn, divided into rows and columns reflecting the row/column structure of the SDRAM. Furthermore, each chip has a number of banks which, if supported by the memory controller, can be opened simultaneously. By spreading subsequent accesses across multiple banks there is the potential to carry out accesses to locations in one bank whilst other banks are inaccessible due to waiting for an open (activate) or close (pre-charge) command to complete.

Access to DDR2 SDRAM is based on commands that are signalled by the use of three lines, /RAS, /CAS and /WE. A sequence of commands is required to access the data at a given location. First the command to open or activate a row must be given, then a command to access a particular column. Once use of a particular row is finished, a 'pre-charge' command must be given to close the row. Data transfer from or to the DDR2 is based on bursts. Rather than accessing a single SDRAM word in each read, a burst of 4 or 8 words is transferred on subsequent half I/O clock cycles.

The burst nature of the DDR2 means that the columns accessed are always aligned to a multiple of the burst length. The least significant bits of the column address then indicate which of the columns within a burst appear at first, with the others in a cyclic rotation.

Figure 7:
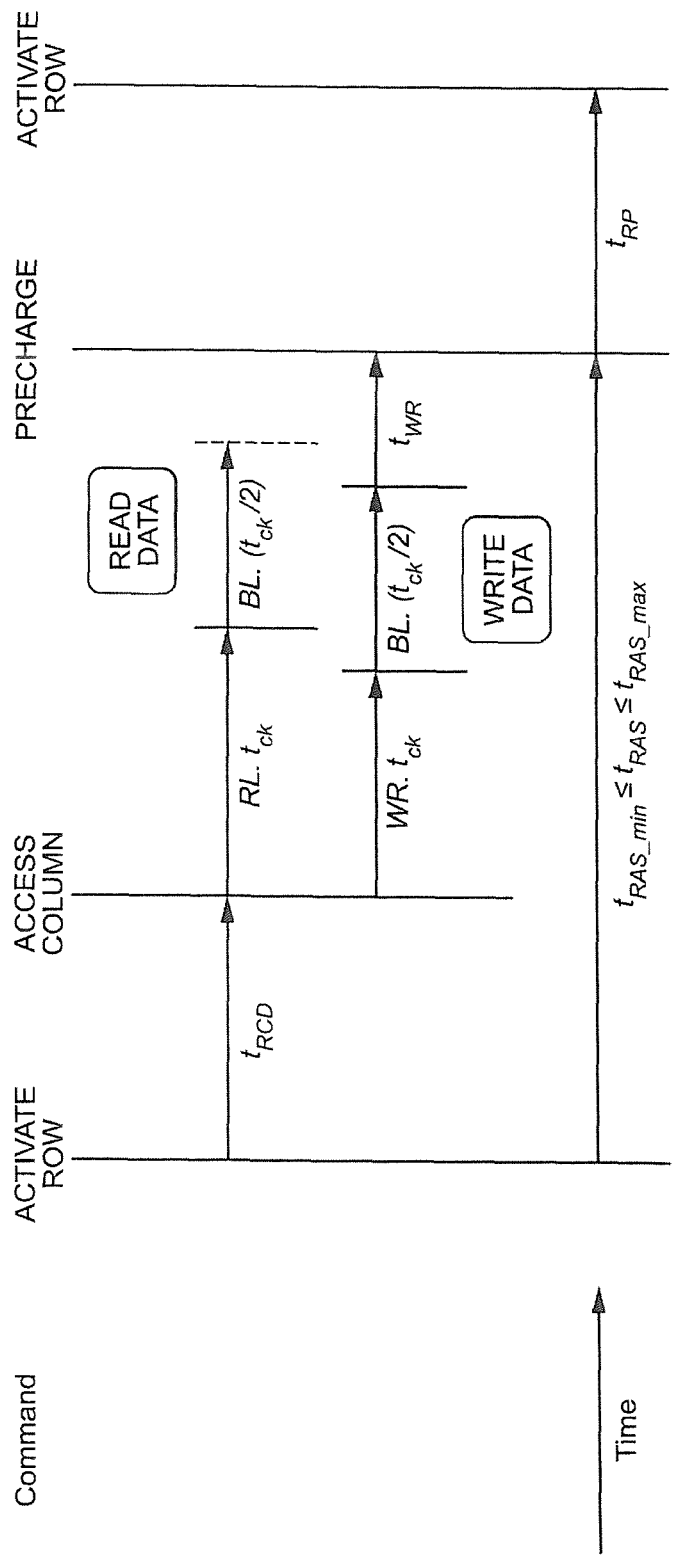
FIG. 7: is a diagram illustrating timing of SDRAM access.

The SDRAM access timing is illustrated in FIG. 7.

The minimum time taken to write a word to an arbitrary, unopened row/column that is subsequently closed is approximately given by:

$$T_{write} = t_{RCD} + WL \cdot t_{ck} + BL \cdot t_{ck}/2 + t_{WR} + t_{RP}$$

where:
$T_{write}$=time taken for a single read operation
$t_{RCD}$=row access time
WL=Write Latency=AL+CL−1
BL=burst length (number of words along row accessed in a single burst)
$t_{CK}$=I/O bus clock period
$t_{WR}$=write recovery time
$t_{RP}$=pre-charge to activate delay Similarly the minimum time taken to read a word is approximately given by:

$$T_{read} = t_{RCD} + RL \cdot t_{ck} + BL \cdot t_{ck}/2 + t_{RP}$$

where:
$T_{read}$=time taken for a single read operation
$t_{RCD}$=row access time
RL=Read Latency=AL+CL
BL=burst length (number of words along row accessed in a single burst)
$t_{CK}$=I/O bus clock period
$t_{RP}$=pre-charge to activate delay In addition, there is a minimum and maximum time that a row can be opened is defined by a bounded parameter $t_{RAS}$.

CL is defined as the 'CAS latency', i.e. the time taken to access a particular column. Additive latency, AL, refers to a technique introduced to DDR2 whereby the column access command can be automatically issued internally by the RAM a defined time after the activate row command. When performing accesses sequentially across different banks, it is possible for accesses to the command bus to be a bottle neck. By reducing the number of commands required to be issued by the controller (in this case removing the column access command) this can remove this limitation.

In the embodying controller, values that are not multiples of the clock frequency are rounded to a multiple of the system clock period.

For a typical RAM part (in this case a KVR667D2U5/1G module) the time for a single read or write to an unopened bank that is subsequently closed is:

$$T_{write} = 109.4 \text{ ns and } T_{read} = 82.08 \text{ ns}$$

This assumes, BL=4, AL=0 and CL=5 for a clock period, $t_{CK}$=6.84 ns (64*16/7=146.29 MHz clock speed). This clock speed was chosen since it is a convenient multiple of the elementary clock speed.

For a DVB-T2 transmission of 8 MHz bandwidth, the output cell period (i.e. the reading of cells from the time interleaver into the T2 frame) is defined as 7/64 μs which equates to 109 ns.

In terms of the time interleaver, this is actually the worst-case (shortest) value. On average, the cell rate required for input and output to the Time Interleaver is somewhat less than this due to the presence of pilots, unused edge carriers and the guard interval which all reduce the capacity of the on-air signal. The effective cell period can be defined as follows:

$$t_{cell\_eff} = D_{data}/T_F$$

For a typical DVB-T2 configuration such as 'Ofcom Mode 7' (defined within the DVB-T2 Validation & Verification group as Test case VV003-CR23), $t_{cell\_eff}$=133 ns. This is actually the maximum average cell rate.

In the embodying Modulator, the Time Interleaver may also be used as a FIFO, ensuring that data is always available to the following frame builder block and the FFT module. A failure to meet the required data rate on reading would mean a break in output. Therefore an additional FIFO would be required on the output of the TI (using valuable block RAM or the static RAM) to smooth out this flow. It would clearly be better if the RAM was capable of operating at the minimum cell period of 109 ns to avoid underflow at the output.

For each cell, both a read and a write are required within this time of 109 ns. There is also an additional penalty for refreshing the RAM (see later). Assuming that read and write operations to TI cells are alternated and that each operation is from/to a random position in the SDRAM, it is clear that a total 191.5 ns is required for a single read/write operation, not allowing for refresh cycles. This is around 40% more than available.

The refresh period for a SDRAM cell is 64 ms, i.e. every row must be refreshed at least this often to avoid the charge on its capacitors draining away. The refresh period, $t_{REFI}$ is calculated by dividing the static refresh period of 64 ms by the number of rows. For the particular module on the HAPS-51 board, with $2^{13}$ rows, this equates to a refresh period, $t_{REFI}$=7.8 μs.

The time taken to perform a refresh, $t_{RFC}$, is quoted as 105 ns for this particular part. Therefore the amount of time that the DDR2 is available for other commands is 7800−105/7800=0.987, i.e. a 1.3% reduction in throughput. A design decision taken within the DDR2 controller core that is being used in the Xilinx, increases this by a factor of two since the module being used had two sets of DDR2 chips on it controlled by a chip select and these are refresh sequentially rather than simultaneously. This avoids a large spike in current consumption by the module. The overall reduction in throughput is around 2.7%.

As explained above, the DDR2 allows multiple banks to be open at once. In this way, it would be possible to arrange that access to subsequent memory locations is across different banks, thereby allowing some of the overheads of opening and closing a row to be hidden behind accesses to other rows.

Figure 8:
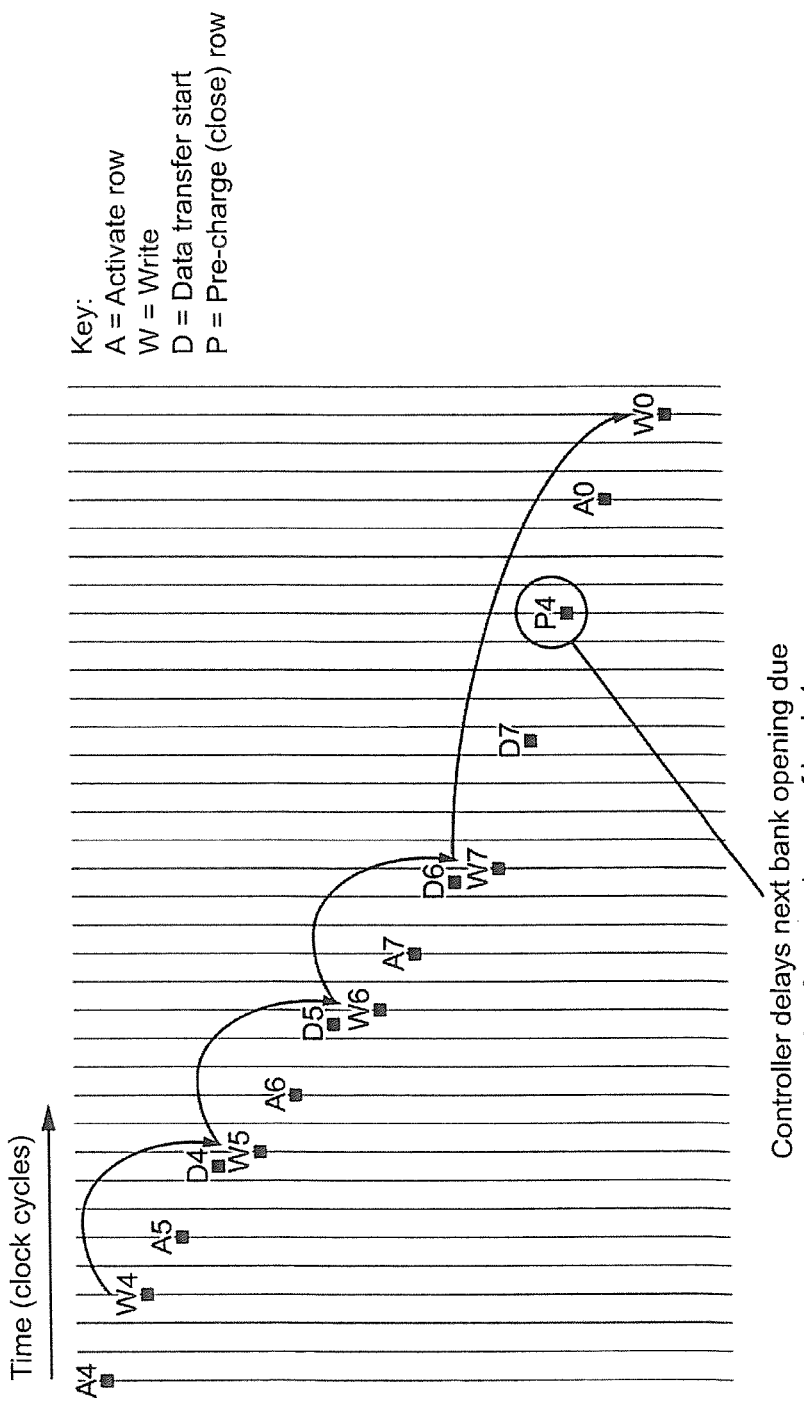
FIG. 8: shows the spreading of access across multiple banks of SD-RAM in a specific example chip.

Unfortunately, it is not possible to take advantage of this for the T2 Time Interleaver in the current hardware. The memory interface 'core' that is generated within the Xilinx Virtex 5 to access the DDR2, whilst supporting multi-bank operation, does not support the automatic closing of rows in the background (so-called 'auto pre-charge' which, in DDR2 is controlled by address line A10), immediately after a read or write burst operation. Instead, it can keep up to four banks open simultaneously but once access to a fifth bank is required, the controller blocks whilst it waits for the least recently used bank to be closed. An example of using multiple banks of the DDR2 RAM is illustrated in FIG. 8 and is based on measurements taken from the Xilinx DDR2 simulation library. This example is for writes only. Initially all banks are closed (following a refresh) and the opening of subsequent banks and access to them can happen in parallel up until the point that access to a fifth, previously unopened, row is required. At this point, there is a delay in activating this row, until row 4 (the least recently used) is closed. In this example, cells were supplied to the RAM at ⅔ of the T2 cell period, i.e. 73 ns, to ensure that the input was not the limiting factor and that the RAM was never waiting for input. The system clock period, $t_{CK}$ was 6.84 ns as before.

For completeness it is noted that the time interleaver block and cell interleaver have a synergy.

The Time Interleaver block in the embodiment sits between the output of the cell interleaver and the frame builder. Data for different PLPs will arrive, one FEC block at a time from the T2-MI interface and be coded as defined by the configuration for that PLP. Each FEC block will emerge from the cell interleaver and be fed into the appropriate block of memory corresponding to the TI for that particular PLP.

On the output, the frame builder will request cells from the different memory blocks as determined by the scheduling for the particular T2 frame in question. Sub-slicing of type 2 PLPs puts a requirement on the minimum number of sequential cells that will be required for a given PLP in one go.

From the DVB-T2 system specification:

$$N_{cells} \bmod \{5 \cdot N_{subslices\_total} \cdot P_I\} = 0$$

i.e.

$$N_{cells} = k \cdot 5 \cdot N_{subslices\_total} \cdot P_I$$

where k is an integer
Also:

$$\text{cells\_per\_subslice} = \frac{PLP\_NUM\_BLOCKS \cdot N_{cells}}{N_{subslices\_total} \cdot P_I}$$

Therefore:

$$\text{cells\_per\_subslice} = 5 \cdot k \cdot PLP\_NUM\_BLOCKS$$

This means that the minimum number of cells in a given sub-slice is always 5.

For the avoidance of doubt, the term memory used herein may optionally cover RAM, dynamic RAM, SDRAM, disk based storage or other storage technology having the read-write properties described.

The invention claimed is:

1. Apparatus for storing and retrieving a stream of data received in successive blocks, the apparatus comprising:
   an input for receiving an input data stream of input data items arranged as blocks;
   a memory coupled to the input, the memory having M logical memory units arranged in groups of N memory units such that accesses to memory units within a group are faster after a first access to a memory unit in that group;
   an address generator coupled to the memory to address the memory units of the memory to write data input items received in the data stream at the input to memory units in the memory and to read data items from the memory units in the memory; and
   an output coupled to the memory to receive and output the data items from memory units read from the memory to form an output data stream;
   in which the address generator generates the addresses of memory units by dividing each block into strips having a strip length n, writing consecutive data items with an address increment equal to the strip length such that the generated addresses are n memory units apart and reading consecutive memory units;
   wherein n<N such that two or more data items may be written within groups of N memory units and two or more data items may be read from groups of N memory units.

2. Apparatus according to claim 1, wherein each group of memory units comprises a row of memory.

3. Apparatus according to claim 1, wherein each group of memory units comprises a burst length.

4. Apparatus according to claim 1, wherein each block comprises rows and columns of data items and wherein the input receives data items in consecutive order and the address generator generates write addresses by writing consecutive data for each column of items n memory units apart.

5. Apparatus according to claim 4, wherein at the end of each column, the address generator jumps to a new address being the next unused address.

6. Apparatus according to claim 1, wherein the input is arranged to receive data items in a non-consecutive order and the address generator generates write addresses so that data is written in the order received or a different order so that consecutive items are written n memory units apart.

7. Apparatus according to claim 6, wherein the input is arranged to receive data items from the output of a DVB-T2 cell interleaver in such an order that they can be written sequentially to the memory units of the interleaver.

8. Apparatus according to claim 1, wherein the strip length n is a fixed value for the apparatus.

9. Apparatus according to claim 1, wherein the memory comprises memory locations each comprising 2 or more memory units.

10. Apparatus according to claim 1, wherein the apparatus is an interleaver.

11. Apparatus according to claim 10, wherein the apparatus is a DVB T2 time interleaver and each block comprises a DVB-T2 TI-block.

12. Apparatus according to claim 1, wherein the strip length n is 5.

13. Apparatus according to claim 1, wherein the memory is arranged to read and write in bursts, with a burst length l>n.

14. Apparatus according to claim 1, wherein the burst length l is 8 memory units.

15. Apparatus according to claim 1, wherein the memory is RAM or an SDRAM.

16. An interleaver or de-interleaver comprising the apparatus of claim 1.

17. A method of storing and retrieving a stream of data received in successive blocks using a memory having M logical memory units arranged in groups of N memory units such that accesses to memory units within a group are faster after a first access to a memory unit in that group, the method comprising:
   receiving an input data stream of input data items arranged as blocks;
   generating addresses to address the memory units of the memory to write data input items received in the data stream at the input to memory units in the memory and to read data items from the memory units in the memory; and
   producing an output data stream from the memory;
   in which the address generator generates the addresses of memory units by dividing each block into strips having a strip length n, writing consecutive data items with an address increment equal to the strip length such that they are n memory units apart and reading consecutive memory units;
   wherein n<N such that two or more data items may be written within groups of N memory units and two or more data items may be read from groups of N memory units.

18. A method according to claim 17, wherein each group of memory units comprises a row of memory.

19. A method according to claim 17, wherein each group of memory units comprises a burst length.

20. A method according to claim 17, wherein each block comprises rows and columns of data items and wherein the data items are received in consecutive order and the address generator generates write addresses by writing consecutive data for each column of items n memory units apart.

21. A method according to claim 20, wherein at the end of each column, the address generator jumps to a new address being the next unused address.

22. A method according to claim 17, wherein data items are received in a non-consecutive order and the address generator generates write addresses so that data is written in the order received or a different order so that consecutive items are written n memory units apart.

23. A method according to claim 22, wherein the data items are received from the output of a DVB-T2 cell interleaver in such an order that they can be written sequentially to the memory units of the interleaver.

24. A method according to claim 17, wherein the strip length n is a fixed value.

25. A method according to claim 24, wherein the strip length n is 5.

26. A method according to any of claim 17, wherein the memory is arranged to read and write in bursts, with a burst length l>n.

27. A method according to claim 17, wherein the burst length l is 8 memory units.

* * * * *